US005578523A

United States Patent [19]
Fiordalice et al.

[11] Patent Number: 5,578,523
[45] Date of Patent: Nov. 26, 1996

[54] METHOD FOR FORMING INLAID INTERCONNECTS IN A SEMICONDUCTOR DEVICE

[75] Inventors: Robert W. Fiordalice; Papu D. Maniar; Jeffrey L. Klein, all of Austin, Tex.

[73] Assignee: Motorola, Inc., Schaumburg, Ill.

[21] Appl. No.: 444,184

[22] Filed: May 18, 1995

Related U.S. Application Data

[63] Continuation-in-part of Ser. No. 393,782, Feb. 24, 1995, Pat. No. 5,534,462.

[51] Int. Cl.$^6$ ................................................. H01L 21/44
[52] U.S. Cl. .................... 437/190; 437/192; 437/194; 437/195; 437/228; 437/203
[58] Field of Search ................................. 437/190, 203, 437/192, 194, 195, 225, 228, 245; 216/52, 18; 156/652.1

[56] References Cited

U.S. PATENT DOCUMENTS

| | | | |
|---|---|---|---|
| 4,184,909 | 1/1980 | Chang et al. | 156/643 |
| 4,789,648 | 12/1988 | Chow et al. | 437/225 |
| 4,832,789 | 5/1989 | Cochran et al. | 437/228 |
| 4,884,123 | 11/1989 | Dixit et al. | 357/71 |
| 4,936,950 | 6/1990 | Doan et al. | 156/643 |
| 4,981,550 | 1/1991 | Huttemann et al. | 156/643 |
| 4,997,789 | 3/1991 | Keller et al. | 437/194 |
| 5,064,683 | 11/1991 | Poon et al. | 427/39 |
| 5,225,372 | 7/1993 | Savkar et al. | 437/190 |
| 5,272,117 | 12/1993 | Roth et al. | 216/52 |
| 5,328,553 | 7/1994 | Poon | 437/228 |
| 5,332,467 | 7/1994 | Sune et al. | 156/636.1 |
| 5,399,235 | 3/1995 | Mutsaers et al. | 437/194 |

OTHER PUBLICATIONS

J. Givens, et al.; "Selective dry etching in a high density plasma for 0.5 μm complementary metal–oxide–semiconductor tech.;" J. Vac. Sci. Technol. B, vol. 12, No. 1, pp. 427–432 (Jan./Feb. 1994).

C. Yu, et al.; "Deposition, Characterization, and Application of Aluminum Nitride Thin Films for Microelectronics;" Mat. Res. Soc. Symp. Proc., vol. 264, pp. 401–405 (1992).

S. Bhat, et al.; "Reactive Ion Beam Deposition of Aluminium Nitride Thin Films;" Journal of Elect. Materials, vol. 14, No. 4, pp. 405–418 (1985).

R. K. Sadhir, et al.; "Preparation of Aluminum Nitride Thin Films for Use in Microelectronics;" IEEE; Ch. 2452–1, pp. 17–21 (1987).

R. G. Gordon, et al.; "Chemical vapor deposition of aluminum nitride thin films;" J. Mater. Res., vol. 7, No. 7, pp. 1679–1684 (1992).

S. J. Pearton, et al.; "Dry and wet etching characteristics of InN, AlN, and GaN deposited by electron cyclotron . . . ;" J. Vac. Sci. Technol. A, vol. 11, No. 4, pp. 1772–1775 (1993).

P. B. Legrand, et al.; "Optical properties of sputter–deposited aluminium nitride films on silicon;" SSDI, pp. 220–223 (1994).

C. W. Kaanta, et al; "Dual Damascene: A ULSI Wiring Technology;" Proceeedings of Jun. 11, 12, 1991 IEEE VLSI Multilevel Interconnect Conference; pp. 144–152 (Jun. 1991).

*Primary Examiner*—Tuan H. Nguyen
*Attorney, Agent, or Firm*—Patricia S. Goddard

[57] ABSTRACT

In the present invention, an inlaid interconnect (44) is formed by chemical mechanical polishing. A polish assisting layer (31), in the form of an aluminum nitride layer, is formed between an interlayer dielectric (30) and an interconnect metal (42) to prevent dishing or cusping of the interconnect upon polishing. By allowing the sacrificial polish assisting layer (31) to be removed at close to the same rate as interconnect metal (42) during the final stages of polishing, dishing is avoided. The aluminum nitride layer also facilitates chemical vapor deposition of aluminum as the interconnect metal by providing a more suitable nucleation site for aluminum than exists with silicon dioxide.

21 Claims, 3 Drawing Sheets

METHOD FOR FORMING INLAID INTERCONNECTS IN A SEMICONDUCTOR DEVICE

CROSS-REFERENCE TO RELATED APPLICATION

The present application is a continuation-in-part of a commonly assigned, patent application entitled, "Method for Forming a Plug and Semiconductor Device Having the Same," Ser. No. 393,782, filed Feb. 24, 1995, now U.S. Pat. No. 5,534,462 by Robert W. Fiordalice, et al.

FIELD OF THE INVENTION

The present invention relates to semiconductor device manufacturing methods in general, and more specifically to methods for forming inlaid interconnects and polishing interconnect metal layers.

BACKGROUND OF THE INVENTION

Conductive plugs have become an accepted and manufacturable means for electrically connecting metal layers of a semiconductor device to underlying conductive members (such as diffusion regions, polysilicon layers, or other metal layers), especially in 0.35 µm manufacturing technology. Probably the most popular form of conductive plug used in semiconductor manufacturing is a tungsten plug. However, tungsten is dissimilar to the most commonly used metal in semiconductor devices, aluminum. Due to the material dissimilarities, the combination of tungsten plugs with aluminum metal interconnects raises some concerns. For example, problems associated with electromigration and defectivities have been reported or observed in using tungsten plugs in conjunction with aluminum interconnects. Apart from reliability and performance concerns, the use of tungsten plugs is disfavored due to its process complexity. In addition to depositing tungsten to form the plug, layers such as titanium and titanium nitride are often needed to serve as adhesion promoters and diffusion barriers.

For these reasons, it is desirable to have plugs made of the same material as the interconnect, resulting in a "monolithic interconnect." Apart from improved reliability, structures which use monolithic interconnects, wherein the metal serves as both the interconnect itself and as the conductive plug, stud, or via to connect to underlying conductive members have been proposed. See, for example, "Dual Damascene: A ULSI Wiring Technology," by C. W. Kaanta, appearing in the proceedings of the June, 1991 VLSI Multilevel Interconnect Conference. In almost all monolithic interconnects which have been proposed, chemical mechanical polishing (CMP) is utilized to etch or polish back a blanket layer of metal, leaving metal only in recessed or trenched areas of the underlying substrate. The left over metal is often referred to as an inlaid interconnect, meaning that the interconnect metal has been laid into the surrounding dielectric layer as opposed to the dielectric layer being formed around the metal interconnect.

A problem has arisen in the use of CMP to form inlaid interconnects, particularly those formed of aluminum. The problem is sometimes referred to as "dishing" or "cusping." An example of the problem is illustrated in FIG. 1, which is a cross-sectional illustration of a portion of a semiconductor device 10. Semiconductor device 10 includes a semiconductor substrate 12 having an overlying dielectric layer 14. As an example, semiconductor substrate 12 is a silicon wafer having an overlying silicon dioxide layer. Within dielectric layer 14, an opening 16 has been etched. After etching opening 16, a blanket layer of metal, such as aluminum, is deposited over device 10, and subsequently polished back to remove portions of the aluminum which lie beyond opening 16. Upon polishing, the only portion of the aluminum which remains in device 10 is that which is within opening 16. The metal remaining within opening 16 forms an interconnect 18. As is evident from FIG. 1, interconnect 18 is not planar with the surrounding dielectric layer 14. Instead, interconnect 18 is slightly recessed within the opening, creating a dishing or cusping effect. The dishing phenomenon is particularly apparent when the width of opening 16 is relatively large, for example greater than one micron. The dishing effect observed in the inlaid interconnect is problematic because the recession in the device typography is replicated to subsequent layers deposited upon device 10.

One way to avoid the dishing problem is to eliminate large metal structures (for example greater than one micron in width) from the device. However, this is not a practical solution because, for example, the device requires metal bond pads which occupy relatively large areas.

In view of the desirability for a semiconductor manufacturer to form monolithic or inlaid interconnects, a need exists for a method to form such interconnects without some of the problems associated with prior attempts, such as the problem of dishing.

DETAILED DESCRIPTION OF A PREFERRED EMBODIMENT

Figure 1:
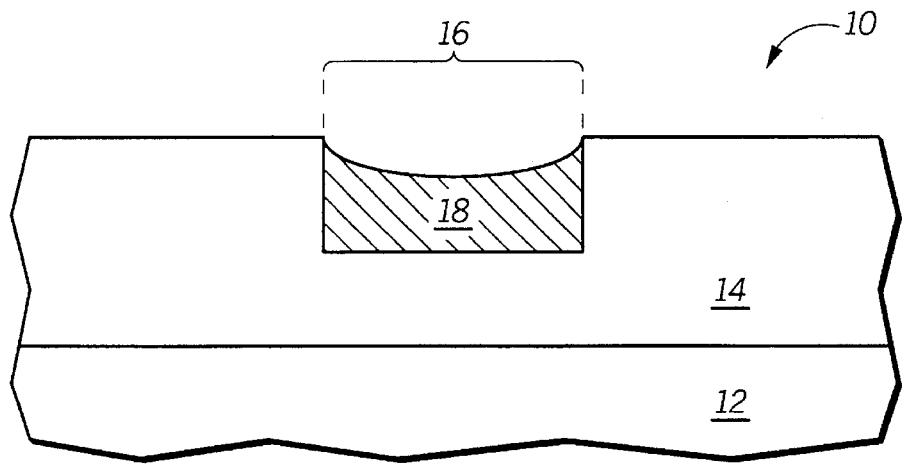
FIG. 1 is a cross-sectional illustration of a portion of a semiconductor device illustrating a problem referred to as "dishing."

Generally, the present invention provides a method for forming inlaid interconnects in a semiconductor device which utilizes a polish assisting layer. In one embodiment, the polish assisting layer is formed of aluminum nitride. The aluminum nitride polish assisting layer facilitates the step of polishing the metal interconnect layer by reducing the likelihood of dishing or cusping of the metal within a defined interconnect opening. Traditionally, in using aluminum as an interconnect metal layer, upon polishing excessive portions of the aluminum from the device inlaid portions of the aluminum which are to remain as the interconnect are often dished. It is believed that the dishing occurs due to polishing rate differences between aluminum and the underlying dielectric layer, which is usually in the form of a silicon dioxide. The aluminum is much softer than the silicon dioxide and polishes much faster. In order to insure that all portion of the aluminum layer existing beyond the interconnect opening are removed for electrical reasons, the device may be over polished. As a result of over polishing, the aluminum within the interconnect opening continues to be removed and at a rate faster than the surrounding silicon dioxide, thus resulting in the dishing or cusping effect illustrated in FIG. 1.

In one embodiment of the present invention, the aluminum nitride polish assisting layer is deposited between the dielectric layer and the metal interconnect layer. Upon polishing the metal interconnect layer, any over polishing which is performed to insure that all of the aluminum is removed beyond the interconnect opening exposes the aluminum nitride layer rather than the silicon dioxide dielectric layer. Aluminum nitride has a polishing rate similar to aluminum in a same slurry and under the same processing conditions. During final stages of polishing, aluminum and aluminum nitride are removed substantially uniformly. As a result, the metal within the interconnect opening is not etched faster than surrounding layers, and thus is not recessed within the interconnect opening. A further advantage in using an aluminum nitride polish assisting layer is that the layer enhances chemical vapor deposition (CVD) of aluminum by providing a better suited nucleation layer than prior art attempts for depositing aluminum using CVD. Yet another advantage of using an aluminum nitride polish assisting layer is that it is a dielectric material, so that it is not necessary for the polish assisting layer to be completely removed during the polishing step. Over polishing to ensure removal of the metal can be terminated prior to full removal of the polish assisting layer without adverse effects. As a result, the polishing process is more tolerant.

These and other features and advantages will be more clearly understood from the following detailed description taken in conjunction with the accompanying drawings..It is important to point out that the illustrations are not necessarily drawn to scale, and that there are most likely other embodiments of the present invention which are not specifically illustrated. Further, it is noted that like reference numerals are sometimes used throughout the various views to denote identical or similar elements.

Figure 2:
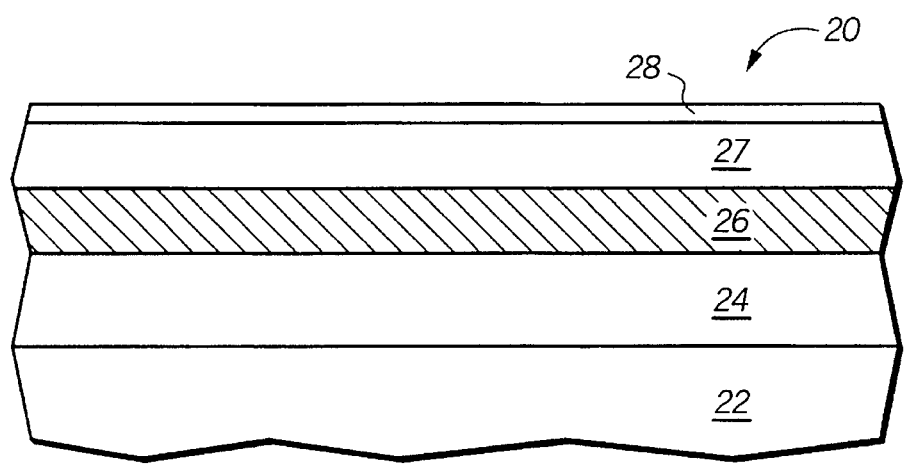
FIGS. 2–7 illustrate in cross-section a portion of a semiconductor device as the device undergoes processing steps in accordance with the present invention to form inlaid interconnects.

FIGS. 2–7 illustrate in cross-section a portion of a semiconductor device 20 as it undergoes processing steps in accordance with the present invention to form an inlaid interconnect. As shown in FIG. 2, an initial structure includes a semiconductor substrate 22 having an overlying dielectric layer 24 and a conductive member 26. In semiconductor devices such as integrated circuits, substrate 22 will generally be a single crystal silicon wafer, but can instead be a silicon on insulator (SOI) substrate, a silicon on sapphire (SOS) substrate, a gallium arsenide substrate, or the like. Dielectric layer 24 is generally a silicon dioxide based material, such as phospho-silicate-glass (PSG), boron doped PSG (BPSG), thermal oxide, tetra-ethyl-ortho-silicate (TEOS), spin-on-glass (SOG), or CVD oxide, deposited either with or without plasma enhancement. In one form, conductive member 26 is a metal interconnect. However, any conductive member of a semiconductor device is suitable, including polysilicon members, silicide regions, refractory metals, or even a diffused region (in which case the conductive member would be formed directly in substrate 22, without an intervening dielectric layer 24).

Conductive member 26 is shown as being formed directly on dielectric layer 24, which in turn is shown as being formed directly on substrate 22. However, one will appreciate that there can be numerous intervening layers between the conductive member, dielectric layer, and substrate. For example, polysilicon layers, doped regions, isolation regions, silicide regions, and various dielectric layers or spacers used to form an active device (such as a transistor) are likely to be present. For purposes of understanding the present invention, however, an understanding of these intervening layers is not necessary, and thus will not be included. Furthermore, conductive member 26 is not even required in practicing the present invention, but in most instances an inlaid interconnect will at some point in the device have an electrical connection to an underlying conductive member. It is noted that in one embodiment, conductive member 26 is itself a metal interconnect. In which case, the method hereafter described for practicing the present invention can be used to form conductive member 26 as well as for forming an overlying inlaid interconnect as described below.

Also included in the initial device structure illustrated in FIG. 2 is an interlayer dielectric 27 and an etch stop layer 28 overlying conductive member 26. Interlayer dielectric 27 will generally be a silicon based dielectric such as PSG, BPSG, TEOS, SOG, or CVD oxide. Etch stop layer is a dielectric material which can be etched selectively to interlayer dielectric 27. Suitable dielectric materials include titanium dioxide ($TiO_2$), aluminum oxide ($Al_2O_3$), aluminum nitride (AlN), or silicon nitride ($Si_3N_4$). The initial device structure as illustrated in FIG. 2 is formed in accordance with known processes, which for purposes of understanding the present invention need not be discussed herein.

Figure 3:
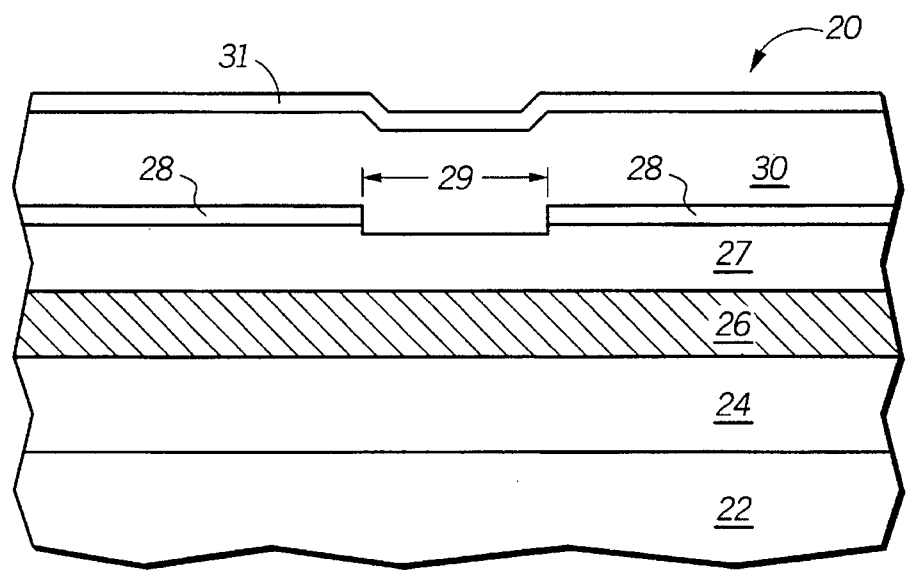

In a preferred embodiment of the present invention, an inlaid interconnect is formed within a combination of interlayer dielectrics. FIG. 2 illustrates the first of these interlayer dielectric layers. A second interlayer dielectric 30 is also utilized, as illustrated in FIG. 3. Etch stop layer 28 separates the first and second interlayer dielectrics. However, as FIG. 3 indicates, etch stop layer 28 is patterned and etched prior to depositing second interlayer dielectric 30 to form opening 29. Opening 29 can be formed using conventional lithography and reactive ion etching (RIE) techniques. While preferably the etch used to form the opening should be selective to interlayer dielectric 27, any etching of interlayer dielectric 27 is not harmful. Opening 29 will eventually be used to define a vertical or a plug portion of the final inlaid interconnect, as will become apparent in reference to FIG. 5. Accordingly, portions of interlayer dielectric 27 beneath and within opening 29 will subsequently be removed. Interlayer dielectric 30 is deposited after forming opening 29 using known techniques. Interlayer dielectric 30 is formed on etch stop layer 28 of the same types of materials used to form interlayer dielectric 27 (e.g. PSG, BPSG, TEOS, SOG, or CVD oxide), and using conventional deposition techniques.

In order to form an inlaid interconnect within interlayer dielectrics 27 and 30, an opening must be formed through the layers. In accordance with the present invention, prior to forming the interconnect opening, and as illustrated in FIG. 3, a polish assisting layer 31 is formed on the uppermost interlayer dielectric 30. Polish assisting layer 31 is preferably an aluminum nitride layer, which in a preferred form is deposited using reactive sputtering (RS) within an aluminum target in a nitrogen environment, either pure or in the presence of inert gases such as helium, argon, or the like. Specific process parameters are likely to vary by reactor type and other variables, but can generally be defined as using a substrate temperature of 20° to 500° C., a nitrogen partial pressure of 1.0 to 8.0 mTorr, and a cathode power of 0.5 to 8.0 kWatt. More specifically, an RS process employing 4.0 mTorr nitrogen partial pressure, 300° C. substrate temperature, and 3.0 kWatt cathode power is preferred. A sputter process using a composite aluminum nitride target is also suited for producing polish assisting layer 31, in which case reactive mode sputtering need not be employed. Other methods of depositing an aluminum nitride layer are also suitable for forming polish assisting layer 31, for instance CVD. Preferably, polish assisting layer 31 is deposited to a thickness of 200–1000 angstroms (20–100 nanometers), and most preferably to about 500 angstroms (50 nanometers).

Figure 4:
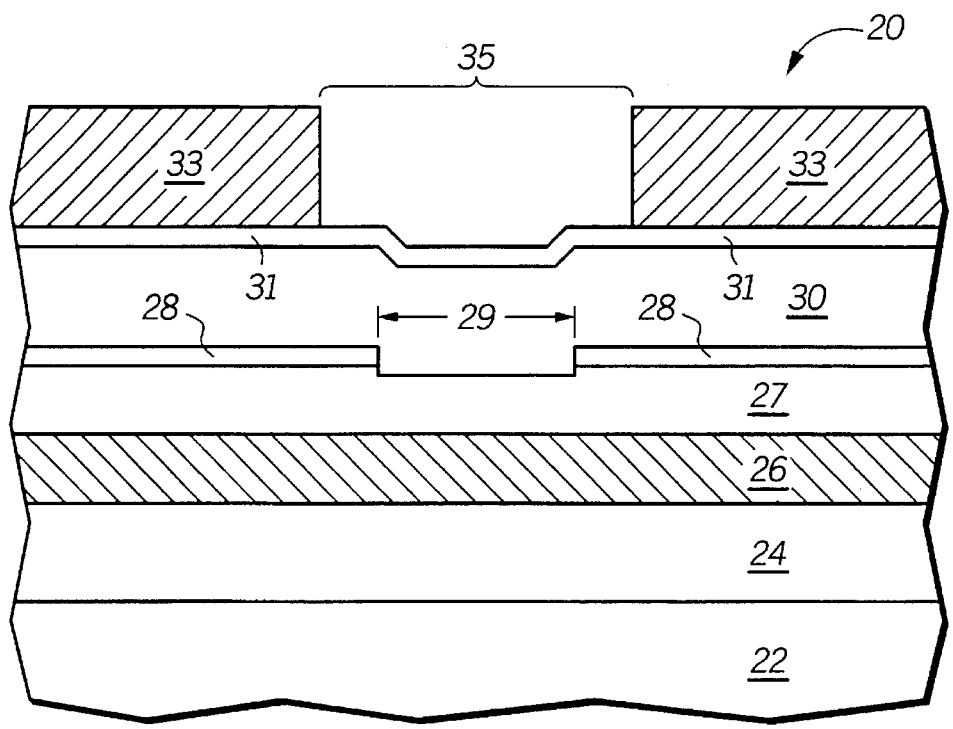

After depositing polish assisting layer 31, device 20 is patterned with a masking layer 33 using conventional lithographic techniques, as shown in FIG. 4. In one form, masking layer 33 is a photoresist layer. The pattern of masking layer 33 establishes an opening 35 which exposes portions of polish assisting layer 31. After defining masking layer 33, device 20 is subjected to an etch (e.g. RIE) which etches both polish assisting layer 31 (formed of aluminum nitride) and interlayer dielectric 30 (formed of silicon dioxide). In a fluorine based chemistry, aluminum nitride will etch at a slower etch rate (e.g. three times slower) than silicon dioxide is etched once the etch system is stabilized and polymerization occurs. However, during the initial stages of the etch (prior to polymerization) fluorine chemistries will etch aluminum nitride at a rate sufficient to remove the aluminum nitride layer exposed within opening 35. If the aluminum nitride layer is relatively thick, a chlorine based etch chemistry can be used to more quickly remove the polish assisting layer, followed by a fluorine etch to continue to etch through interlayer dielectric 30.

Figure 5:
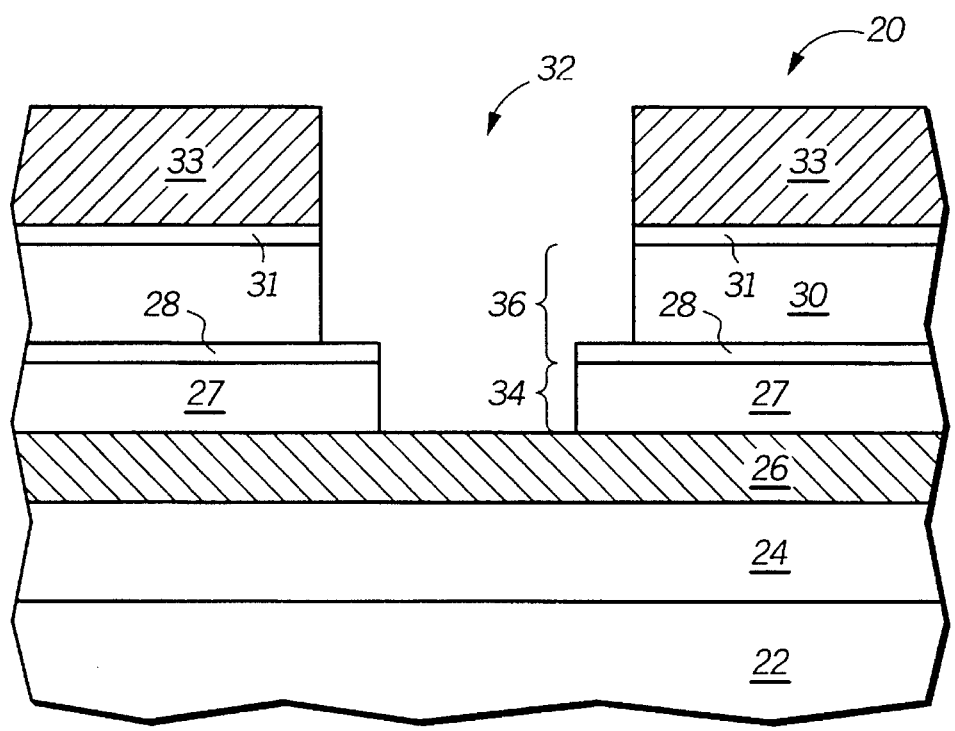

After etching through polish assisting layer 31 within opening 35, the underlying interlayer dielectric 30 is etched (either with the same chemistry or by switching to a fluorine based chemistry as discussed above). Etching of interlayer dielectric 30 continues down to etch stop layer 28. Upon reaching etch stop layer 28, the etch continues but is partially blocked by the etch stop. Portions of interlayer dielectric 27 lying under and within opening 29 of the etch stop layer will be etched. Portions of interlayer dielectric 27 lying beneath remaining portions of the etch stop (and not beneath opening 29) will be protected from the etch. Because interlayer dielectrics 27 and 30 are preferably of the same type of material, a different etch chemistry is not needed. Etching of interlayer dielectric 27 continues until exposing underlying conductive member 26, as illustrated in FIG. 5.

The result of this etching sequence is the formation of an interconnect opening 32. As illustrated in FIG. 5, opening 32 has two portions, a via portion or plug portion 34 and an interconnect portion 36. Plug portion 34 is that area of opening 32 which exposes underlying conductive member 26 for subsequent contact to the conductive member, while interconnect portion 36 is that portion in which the majority of the interconnect will be formed. After depositing a metal into opening 32, as shown and described subsequently, the metal which exists within plug portion 34 serves as a vertical connection between various conductive layers in device 20. Interconnect portion 36, on the other hand, will provide horizontal electrical signal routing upon formation of an inlaid interconnect within opening 32.

The horizontal dimensions of plug portion 34 were defined by opening 29 in etch stop layer 28, while the horizontal dimensions of interconnect portion 36 were defined by opening 35 formed in masking layer 33. As illustrated in FIG. 5, plug portion 34 is smaller in width (W) than interconnect portion 36. While in some instances this may be a preferred configuration, it is not necessarily required. One the one hand, it is desirable to have a plug portion 34 smaller than the area of conductive member 26 to be contacted to provide sufficient alignment tolerances for aligning opening 32 over conductive member 26. The alignment tolerance can be built in by making plug portion 34 smaller than the portion of conductive member to be contacted. It should also be noted that while the process for forming opening 32 was described rather specifically (e.g. using two interlayer dielectrics separated by an etch stop layer), any method for forming an inlaid interconnect opening in a dielectric layer is suitable for practicing the present invention. A polish assisting layer can be utilized in conjunction with a variety of methods for forming openings in a dielectric layer.

Figure 6:
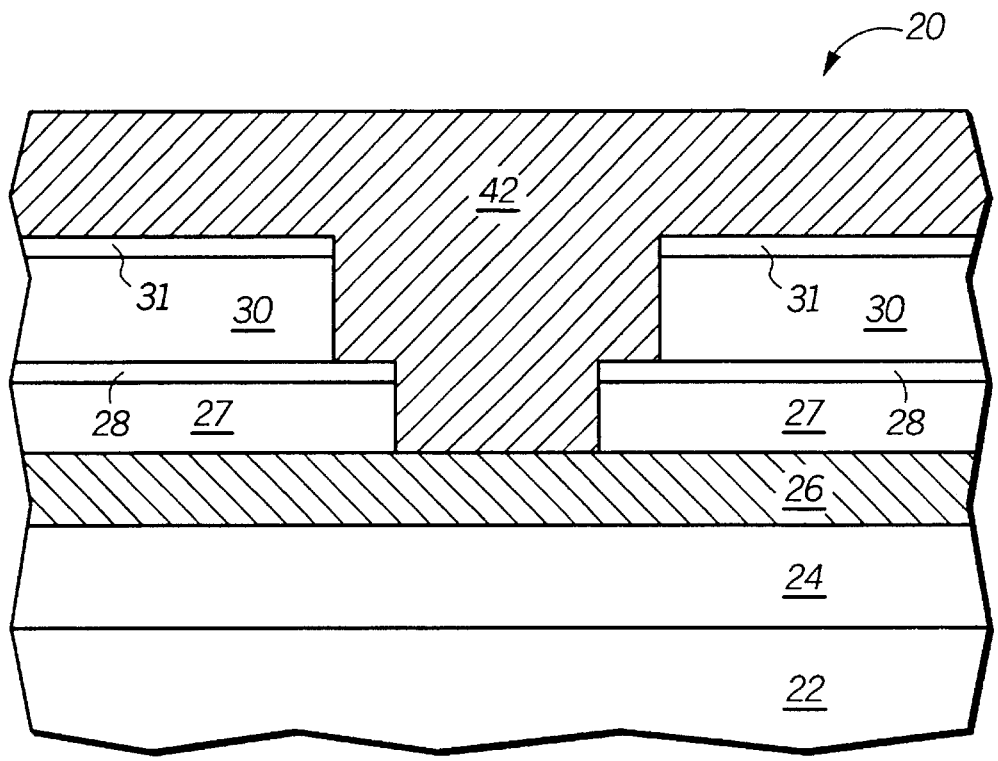

After forming opening 32, an interconnect metal 42, preferably aluminum, is deposited on device 20, as illustrated in FIG. 6. Interconnect metal 42 is deposited such that it fills opening 32, being in electrical and physical contact with underlying conductive member 26. Because deposition of the interconnect metal will not be selective to deposition within opening 32 alone, the interconnect metal will likewise deposit on top of polish assisting layer 31, as FIG. 6 illustrates. Interconnect metal 42 may be deposited in a variety of ways, including sputter deposition, hot deposition, or CVD. Sputtering is the traditional method for depositing aluminum, but for purposes of inlaid interconnect suffers from the problem of poor step coverage. Sputtering deposits metal in a "line of site" manner, and therefore does not adequately fill deep contacts or vias. Hot aluminum processing involves sputter depositing aluminum at a high enough temperature (e.g. greater than 450° C.) sufficient to allow the metal to be mobile at the deposition temperature. During the deposition, it hoped that the aluminum will sufficiently fill opening 32 due to its mobility. In another form of hot processing, the metal is deposited and then subsequently heated to reflow and fill the opening. Hot processes are disfavored, however, because of the high temperatures involved. Multi-level metal devices have thermal budget constraints for backend processing which would not support hot aluminum processing. CVD is widely used for depositing some metals, including tungsten, but has not widely been accepted for the deposition of aluminum. Reported problems of CVD aluminum include process instability, resulting in poor deposited film quality, and the inability to control dopants in CVD deposited aluminum. However, in practicing the present invention, CVD of aluminum has advantages over prior attempts of CVD aluminum. The advantage lies in the existence of polish assisting layer 31 in the form of aluminum nitride. In past attempts at using CVD aluminum, it was difficult to nucleate a layer of aluminum across the entire device, particularly on silicon dioxide based layers, resulting in poor uniformity in the deposited film. With the present invention, the aluminum nitride layer provides a nucleation site for aluminum deposition.

In a preferred embodiment, CVD of aluminum is accomplished using dimethyl-aluminum hydride in a liquid form in a metal organic CVD (MOCVD) process. A liquid dimethyl-aluminum hydride source is introduced into the deposition chamber of an MOCVD system by bubbling helium or hydrogen through the liquid source. Dilutant gases of hydrogen or other gas may be introduced into the chamber to maintain overall pressure in the system. The substrate temperature within the chamber is elevated, but kept to below 300° C. to avoid problems associated with high temperature back end processing. The metal source decomposes at the elevated temperature of the substrate surface. Hydrogen reduces the metal organic molecules in the metal source to deposit a blanket layer of aluminum on the device. Deposition is maintained until a sufficient thickness of metal (for example, 1,000 to 10,000 angstroms) is deposited to fill opening 32. If desired, interconnect metal may then be doped, for instance with copper, to improve performance and reliability. Doping may be accomplished by one of several methods. One method is to deposit a layer of the dopant or material doped with the dopant onto the interconnect metal and thermally driving dopant atoms into the interconnect metal layer. Another method being investigated is to incorporate the dopant into the metal deposition in an in-situ CVD process. Because the use of an aluminum nitride polish assisting layer enhances the quality of the CVD deposited aluminum film, it is expected that the ability to dope the aluminum film would likewise be enhanced.

As previously mentioned, interconnect metal 42 will deposit on polish assisting layer 31 as well since deposition is non-selective. In order to establish proper electrical isolation of the interconnects within device 20, excessive interconnect metal must be removed. In a preferred embodiment this is accomplished using chemical mechanical polishing (CMP). As illustrated, in FIG. 7, portions of interconnect metal 42 beyond opening 32 and originally overlying polish assisting layer 31 are removed from device 20. In removing excess portions of interconnect metal 42 by polishing, a monolithic interconnect 44 is formed inlaid into interlayer dielectrics 27 and 30. Interconnect 44, although monolithic, has two distinct portions, namely a plug portion 46 and an interconnect portion 48, corresponding to the plug portion and the interconnect portion of opening 32.

Figure 7:
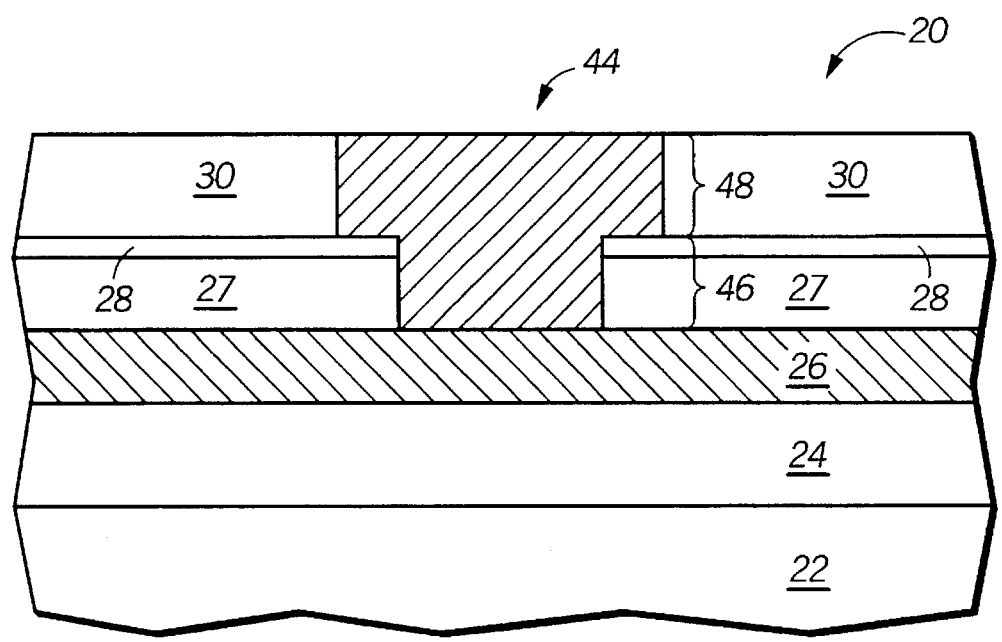

It is noted that interconnect portion 48 as illustrated in FIG. 7 does not have the dishing or cusping problem associated with prior art in laid metal interconnects. Instead, the interconnect has an exposed upper surface which is substantially planar within opening 32 and with the surrounding interlayer dielectric 30. This is due to the presence of polish assisting layer 31. In polishing excessive portions of interconnect metal 42, upon reaching polish assisting layer 31, polish assisting layer 31 and interconnect metal 42 are polished at substantially even rates. In contrast, interconnect metal 42 is polished at a faster rate than interlayer dielectric 30. Thus in prior art devices, upon reaching interlayer dielectric 30 during a polishing operation (there being no polish assisting layer between the interconnect metal and interlayer dielectric), the interconnect metal within the opening continues to be etched or removed at a faster rate than the interlayer dielectric. The result was a recessed portion of the interconnect metal within the interconnect opening. With the present invention, during the last stages of the polishing process, interconnect metal 42 is being removed along with an aluminum nitride polish assisting layer. Thus, upon reaching the aluminum nitride layer during polishing, the aluminum nitride and the aluminum interconnect metal will be polished substantially uniformly.

In accordance with one embodiment of the present invention, interconnect metal 42 in the form of aluminum is polished using a ferric nitrate slurry having alumina abrasives. Although typically this slurry is used to polish tungsten, the slurry also works for polishing aluminum. With this slurry, the polishing rates of aluminum and aluminum nitride were much more similar than the rates between aluminum and silicon dioxide. More specifically, the polishing rates were about 2,200 angstroms per minute for aluminum, 1,300 angstroms per minute for aluminum nitride, and 300 angstroms for silicon dioxide. In comparing the polishing rates of aluminum nitride and silicon dioxide, using the slurry mentioned it was found that aluminum nitride polished three times the rate of silicon dioxide. While the mentioned slurry is likely not the only slurry that can be used with the present invention, it is preferred that for any slurry used to polish the metal interconnect, the aluminum nitride polish assisting layer has a polishing rate of at least twice that of interlayer dielectric 30 under the same set of polishing conditions which are to be used to polish the interconnect metal 42.

The foregoing description and illustrations contained herein demonstrate many of the advantages associated with the present invention. In particular, it has been revealed that a method for forming inlaid interconnects, particularly aluminum interconnects, is available without the negative effects of dishing or cusping known to prior art methods.

With the use of a aluminum nitride polish assisting layer, dishing or cusping effects are minimized by providing a sacrificial dielectric material which polishes uniformly with the interconnect metal during the last stages of the polishing operation. A further advantage of using aluminum nitride as a polish assisting layer is that the material is dielectric, such that upon polishing it is not essential that the polish assisting layer be completely removed. Portions of the aluminum nitride layer can remain within the device without sacrificing device integrity. Yet another advantage of using aluminum nitride as the polish assisting layer is that it will facilitate nucleation of aluminum during a CVD process. CVD aluminum is preferred in an inlaid interconnect process because is excellent step coverage and resistivity.

In other embodiments, the polish assisting layer is not limited to aluminum nitride, and the metal interconnect is not limited to aluminum. The polish assisting layer can include oxides or nitrides of titanium, tungsten, tantalum, or the like. The polish assisting layer may be a conductor or an insulator. The interconnect metal can include titanium, tungsten, copper, or the like. Many different combinations of polishing assisting layers and interconnect metals are possible. In one embodiment, the polish assisting layer and interconnect metal have at least one element in common. Regardless of the combination chosen, the materials for the polish assisting layer and the interconnect metal should be chosen such that, for a given set of polishing or etching conditions, the polish assisting layer is removed at least twice as fast as the immediately underlying interlayer dielectric, and the interconnect metal is removed at least five times faster than that same interlayer dielectric.

Thus it is apparent that there has been provided, in accordance with the present invention a method for forming inlaid interconnects in a semiconductor device that fully meets the needs and advantages set forth previously. Although the invention has been described and illustrated with reference to specific embodiments thereof, it is not intended that the invention be limited to these illustrative embodiments. Those skilled in the art will recognize and understand that modifications and variations can be made without departing from the spirit of the invention. For example, the present invention is not limited to using a particular method for depositing or otherwise forming the polish assisting layer. Nor is the present invention limited to a particular method for depositing the metal interconnect. Furthermore, the present invention is not limited to the method herein described for forming the interconnect opening within the interlayer dielectric. Rather, the present invention encompasses any method for forming a conductive member or interconnect within or inlaid within a dielectric layer. Furthermore, the present invention is not limited to using aluminum as the interconnect metal. Nor is the invention limited to any particular type of semiconductor device in which an interconnect may be formed. It is also understood that while only one interconnect structure was formed during the process steps described herein, in practice, a multiplicity of interconnect structures will be simultaneously formed. Moreover, the present invention is applicable to forming inlaid conductive members at any point during semiconductor manufacturing, and is not specifically limited to a particular metal layer within the device. Therefore, it is intended that this invention encompass all such variations and modifications as fall within the scope of the appended claims.

We claim:

1. A method for forming a semiconductor device comprising the steps of:

providing a semiconductor substrate;

depositing a dielectric layer over the semiconductor substrate;

depositing a polish assisting layer on the dielectric layer, wherein the polish assisting layer is comprised of aluminum nitride;

etching an opening through the polish assisting layer and into the dielectric layer;

depositing a metal layer comprised of aluminum over the semiconductor substrate and on the polish assisting layer, wherein the metal layer fills the opening; and removing portions of the metal layer existing beyond the opening by polishing.

2. The method of claim 1 wherein during the step of removing, the polish assisting layer is also removed.

3. The method of claim 1 wherein the step of etching comprises etching an opening having two different cross-sectional widths.

4. The method of claim 1 wherein the step of etching comprises etching an opening which exposes a conductive member of the semiconductor substrate.

5. The method of claim 1 wherein the step of depositing a metal layer comprises depositing aluminum by chemical vapor deposition.

6. The method of claim 1 wherein the step of depositing a dielectric layer comprises depositing a dielectric layer having a first polishing rate, wherein the step of depositing a polish assisting layer comprises depositing a polish assisting layer having a second polishing rate, wherein the second polishing rate is at least two times as great as the first polishing rate, and wherein the step of removing comprises removing portions of the metal layer by polishing.

7. A method for forming inlaid interconnects in a semiconductor device comprising:

providing a semiconductor substrate having a conductive member formed thereon;

depositing a dielectric layer over the semiconductor substrate, including over the conductive member;

depositing an aluminum nitride layer on the dielectric layer;

etching an interconnect opening through the aluminum nitride layer and into the dielectric layer and exposing the conductive member;

depositing a blanket layer of aluminum over the dielectric layer and the aluminum nitride layer such that aluminum fills the interconnect opening; and polishing the blanket layer of aluminum to remove portions of the blanket layer of aluminum outside of the interconnect opening and form an inlaid interconnect within the interconnect opening in the dielectric layer.

8. The method of claim 7 wherein the step of depositing a blanket layer of aluminum comprises depositing by chemical vapor deposition.

9. The method of claim 7 wherein the step of polishing comprises removing at least portions of the aluminum nitride layer along with the blanket layer of aluminum.

10. The method of claim 9 wherein the step of polishing comprises removing all of the aluminum nitride layer.

11. The method of claim 9 wherein during the step of polishing the at least portions of the aluminum nitride layer are removed at a faster rate than portions of the dielectric layer underlying the at least portions of the aluminum nitride layer are removed.

12. The method of claim 11 wherein during the step of polishing the at least portions of the aluminum nitride layer are removed at least twice as fast as the portions of the dielectric layer underlying the at least portions of the aluminum nitride layer are removed.

13. The method of claim 7 wherein the step of providing a semiconductor substrate comprises providing a semiconductor substrate having a metal interconnect as the conductive member.

14. The method of claim 7 wherein the step of polishing comprises polishing to form an inlaid interconnect having a substantially planar upper surface within the interconnect opening.

15. The method of claim 7 wherein the step of etching an interconnect opening comprises etching an interconnect opening having a first plug portion and a first interconnect portion, and wherein the step of polishing comprises polishing the blanket layer of aluminum to form an inlaid interconnect having a second plug portion formed in the first plug portion of the interconnect opening and a second interconnect portion formed in the first interconnect portion of the interconnect opening.

16. A method for polishing aluminum in a semiconductor device comprising the steps of:

providing a semiconductor substrate having a layer, a polish assisting layer formed on the layer, and an opening formed in the layer, wherein the polish assisting layer is comprised of aluminum nitride;

depositing a metal layer comprised of aluminum on the polish assisting layer and into the opening; and polishing the metal layer to remove the metal layer from on the polish assisting layer while keeping aluminum within the opening to form an inlaid aluminum member in the opening having a substantially planar upper surface.

17. The method of claim 16 wherein the step of providing a semiconductor substrate comprises providing a semiconductor substrate having an opening which exposes a conductive member, and wherein the step of depositing a metal layer comprises depositing a metal layer into the opening an in contact with the conductive member.

18. The method of claim 16 wherein the step of depositing a metal layer comprises depositing by chemical vapor deposition.

19. A method for forming an inlaid interconnect comprising the steps of:

providing a substrate having a dielectric layer formed thereon, wherein the dielectric layer has a first polishing rate;

forming a polish assisting layer on the dielectric layer, wherein the polish assisting layer has a second polishing rate which is greater than the first polishing rate forming an opening in the dielectric layer and in the polish assisting layer;

depositing a blanket layer of a material on and in direct contact with the polish assisting layer and into the opening in the dielectric layer, wherein the material has at least one element in common with the polish assisting layer, and polishing the blanket layer of the material to remove the material from on the polish assisting layer while keeping the material within the opening in the dielectric layer to form an inlaid interconnect within the dielectric layer.

20. The method of claim 19 wherein during the step of polishing the material and the polish assisting layer are removed at least twice as fast as the dielectric layer is removed.

21. The method of claim 19 wherein the at least one element in common is aluminum.

* * * * *